United States Patent [19]
Matsumoto

[11] Patent Number: 5,884,152
[45] Date of Patent: Mar. 16, 1999

[54] AUTOMATIC GAIN CONTROL WITH CONSTANT GAIN COEFFICIENT DURING MOBILE'S RECEIVE TIME SLOT

[75] Inventor: Mariko Matsumoto, Tokyo, Japan

[73] Assignee: NEC Corporation, Tokyo, Japan

[21] Appl. No.: 594,496

[22] Filed: Jan. 31, 1996

[30] Foreign Application Priority Data

Jan. 31, 1995 [JP] Japan .................................. 7-032912

[51] Int. Cl.⁶ .................................................. H04B 1/40
[52] U.S. Cl. .................................. 455/234.1; 455/239.1; 455/70
[58] Field of Search .......................... 455/234.1, 234.2, 455/239.1, 242.1, 243.1, 244.1, 245.1, 245.2, 248.1, 249.1, 250.1, 68, 70; 375/345; 370/314, 347

[56] References Cited

U.S. PATENT DOCUMENTS 5,184,349  2/1993  Riordan .................................. 375/345
5,251,216  10/1993 Marshall et al. ..................... 455/239.1
5,548,594  8/1996  Nakamura .............................. 375/345

FOREIGN PATENT DOCUMENTS 0411756   2/1991  European Pat. Off. ........ H04B 7/005
0455388  11/1991  European Pat. Off. .......... H04B 1/16
61-170165 7/1986  Japan .

*Primary Examiner*—Reinhard J. Eisenzopf
*Assistant Examiner*—Lester G. Kincaid
*Attorney, Agent, or Firm*—Ostrolenk, Faber, Gerb & Soffen, LLP

[57] ABSTRACT

A mobile radio unit receives a time division multiplexed signal and detects the received signal strength of the time division multiplexed signal. An automatic gain control circuit automatically gain controls the degree of amplification of the received signal based on an amplification coefficient controlled by a control circuit and an detection result of a detection circuit, where the amplification coefficient showing follow-up ability of automatic gain control to the received signal strength is variable.

11 Claims, 5 Drawing Sheets

NA: PRE-STORED AMPLIFICATION COEFFICIENT (LARGE)
NB: PRE-STORED AMPLIFICATION COEFFICIENT (SMALL)
VR: CONSTANT LEVEL

AUTOMATIC GAIN CONTROL WITH CONSTANT GAIN COEFFICIENT DURING MOBILE'S RECEIVE TIME SLOT

BACKGROUND OF THE INVENTION

This invention relates to a mobile radio unit formed as a radio selective call receiver, a portable phone and the like in the time division multiplexing communication system and, more particularly, to a mobile radio unit provided with an automatic gain control circuit in its receiving section.

A conventional mobile radio unit has been provided with an automatic gain control circuit so that the received signal level is controlled within a predetermined level upon demodulating and decoding the received signal. The mobile radio unit is often used in the condition where electric field level is likely to change, leading to fluctuation in the reception level. In order to cope with the above problem, the automatic gain control circuit has been constructed to detect a received signal strength (an electric field strength of the received signal) and adjust amplification degree based on the detected received signal strength so as to keep an output level to a predetermined level.

Japanese Patent Application Laid-Open NO. 170165 (1986) has disclosed an invention improving follow-up ability to suitably receive burst signals.

SUMMARY OF THE INVENTION

It is an object of the present invention to solve the above-mentioned problems.

It is another object of the present invention to provide a mobile radio unit for eliminating failure caused by fixing the amplification coefficient and eliminating reception errors to provide efficient function of the automatic gain control circuit.

It is still another object of the present invention to provide a method of automatic gain control for eliminating failure caused by fixing the amplification coefficient and eliminating reception errors to provide efficient function of the automatic gain control circuit.

The objects of the invention are achieved by a mobile radio unit for receiving a time division multiplexed transmission signal, comprising: detection means for detecting a received signal strength; automatic gain control amplification means for automatically gain controlling an amplification degree of a received signal based on an amplification coefficient controlled by a control signal and a detection result of the detection means, wherein the amplification coefficient showing follow-up ability of automatic gain control to a received signal strength is variable; and control means for outputting the control signal to control the amplification coefficient of the automatic gain control amplification means.

Furthermore, the objects of the invention are achieved by a method of automatic gain control for a mobile radio unit, comprising steps of: detecting a received signal strength RSSI(t) at time t; determining whether a transmission station transmits a signal based on a detected received signal strength RSSI(t); setting an amplification coefficient k(t) to a predetermined value when the transmission station does not transmit a signal and/or communication timing is own mobile radio unit communication timing; setting the amplification coefficient k(t) to a value rather than the predetermined value when the transmission station transmits a signal and communication timing is one other than own mobile radio unit communication timing; amplifying the received signal based on an amplification value shown by the following equation, $$Ag(t+1) = Ag(t) - k(t) \times (RSSI(t) - V1),$$

where $Ag(t+1)$ expresses an amplification value at time t+1, $Ag(t)$ is an amplification value at time t and V1 is an ideal value of received signal strength.

The present invention comprises a control means for detecting the received signal strength and means for controlling amplification coefficient of the automatic gain control amplification section based on the detected results, allowing for operating the automatic gain control amplification section by setting the amplification coefficient suitable for the reception state. As a result, the present invention provides more flexible and appropriate reception compared with the prior art in which the amplification coefficient has been fixed.

If it is determined that the base station is OFF by substantially a small value of the detected received signal strength and/or the own mobile radio unit communication timing specified by the time division multiplexing method is addressed to the subject mobile radio unit, amplification coefficient is set to a preset value. If it is determined that the base station is ON and the communication specified by the time division multiplexing method is not addressed to the subject mobile radio unit, amplification coefficient is set to a value larger than the preset value during the operation.

Adjusting the amplification coefficient provides sufficient ability to follow-up the fluctuation of the received signal level as well as preventing reception errors resulted from a widely ranged fluctuation of the amplification degree.

When setting the amplification coefficient to "0", the amplification degree of the automatic gain control amplification section is kept constant. As a result, the reception level is stabilized, thus preventing reception errors.

Setting the amplification coefficient to a large value at a timing just before the subject mobile radio unit starts receiving provides the aforementioned effects. Additionally this eliminates unnecessary controlling of the amplification coefficient, resulting in power saving.

In addition, setting the timing for decreasing the amplification coefficient by the timer realizes accurate control of the amplification coefficient in response to the reception timing of the subject mobile radio unit.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

Next, an embodiment of the present invention is described referring to drawings.

Figure 1:
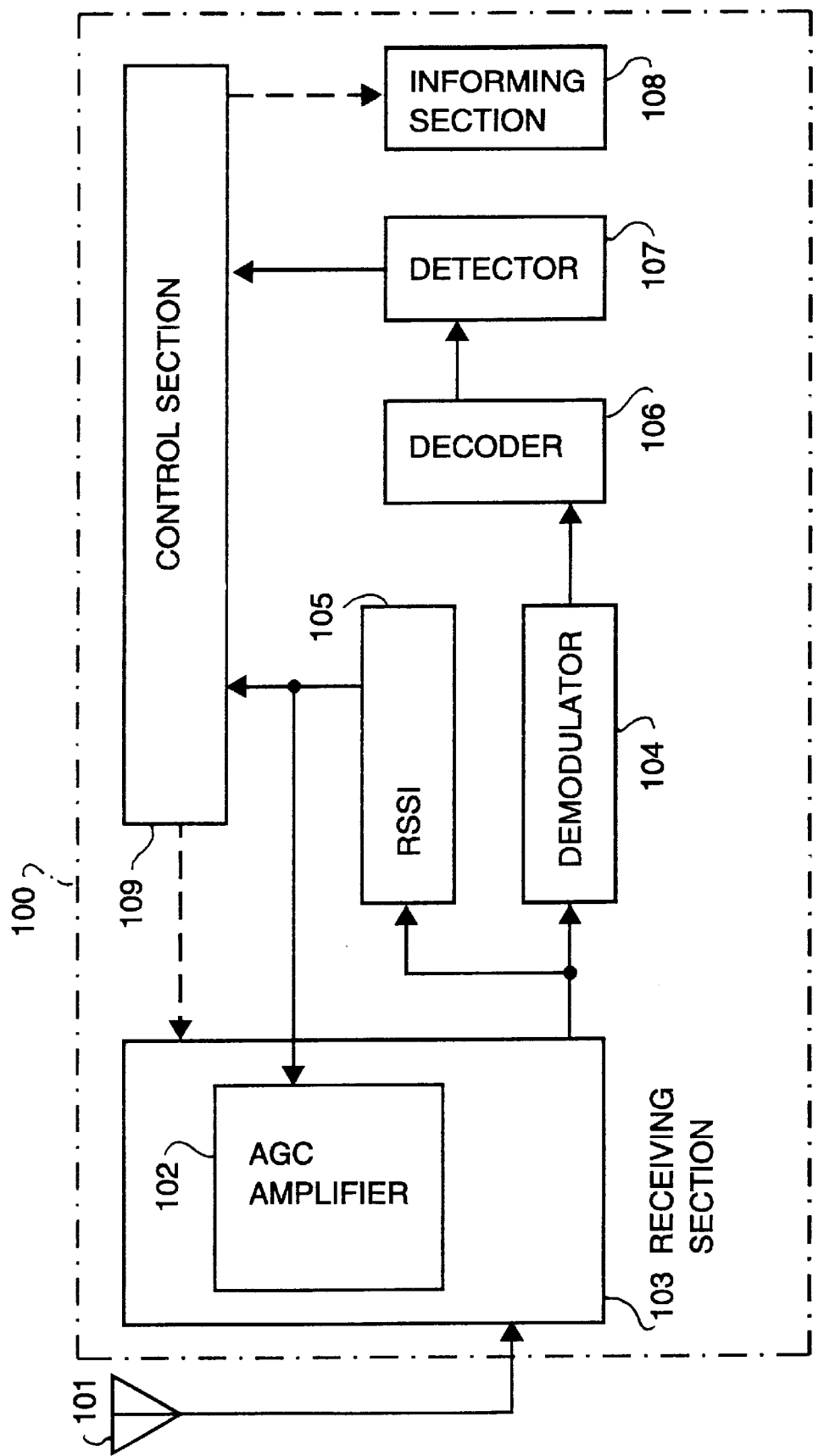
FIG. 1 is a block diagram of a first embodiment of the present invention.

FIG. 1 is a block diagram of an embodiment applied to a mobile radio unit dedicated for receiving such as a radio selective call receiving unit, a radio receiver or the like. In FIG. 1, a solid line designates a signal line and a dashed line designates a control line.

A mobile radio unit 100 receives electric wave via an antenna 101 through a receiving section 103 including an automatic gain control amplifier 102. The received signal is amplified through the automatic gain control amplifier 102. The received signal is further demodulated through a demodulator section 104. The demodulated signal is decoded through a decoding section 106 and input to a detection section 107. The detection section 107 determines whether or not the decoded signal is a communication signal addressed to the subject mobile radio unit. The detection signal of the detection section 107 is input to a control section 109. If the signal is determined to be addressed to the subject mobile radio unit, the control section 109 actuates an informing section 108 for reporting.

The signal received in the receiving section 103 is simultaneously input to an RSSI (Received Signal Strength Indicator) 105 where received signal strength is detected. The resultant detection signal of the RSSI 105 is input to both the automatic gain control amplifier 102 and the control section 109. The automatic gain control amplifier 102 executes automatic gain control operation based on the output of the RSSI 105. Additionally the automatic gain control amplifier 102 is constructed to adjust the amplification coefficient by the control section 109. The amplification coefficient expresses follow-up ability of automatic gain control to the received signal strength.

If the control section 109 detects a timing of the communication addressed to the subject mobile radio unit and/or that the base station stops its transmission (OFF) determined by the detection signal which is lower than a predetermined level, the control section 109 decreases the amplification coefficient to a predetermined value, for example, "0".

The condition where the amplification coefficient is set to "0" represents that the amplification degree of the automatic gain control amplifier 102 is kept (fixed) constant.

While if the control section 109 detects the timing of the communication not addressed to the subject mobile radio unit and the base station executes transmission (ON) determined by substantially a large detection signal of the RSSI 105, the control section 109 increases the amplification coefficient to an above-mentioned predetermined value, for example, a value larger than "0".

Figure 2:
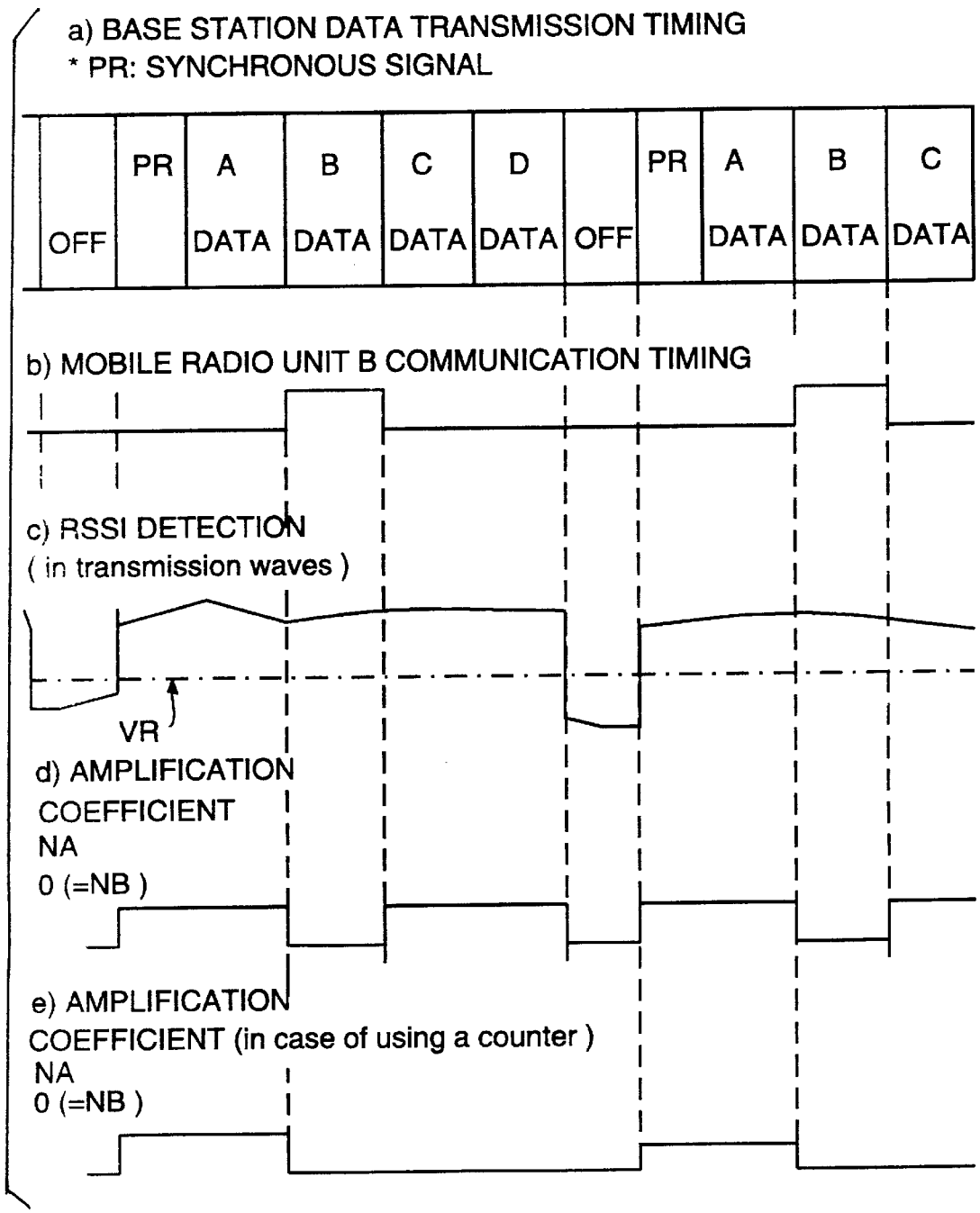
FIG. 2 is a graphical representation showing an operation of the first embodiment.

FIG. 2 is a timing diagram for explaining the operation of the mobile radio unit.

It is assumed that the base station (not shown) executes a time-division transmission as FIG. 2(a) shows. The term "OFF" designates that the base station executes no transmission. The term "PR" is a synchronous signal, "DATA" of each "A" to "D" is transmission data addressed to each mobile radio unit of A to D, respectively. Each mobile radio unit A to D is able to recognize the communication timing of the transmission data addressed thereto by receiving PR. In the above case, it is possible to provide the mobile radio unit with a power saving means such as battery saving for reception in case of necessity.

FIG. 2 shows the operation of the mobile radio unit "B" as an example. FIG. 2(b) shows the communication timing of the mobile radio unit B. When the mobile radio unit B starts receiving, the resultant detection output from the RSSI 105 is generated, for example, as shown in FIG. 2(c). If the base station is ON, the detection output is equivalent to or higher than a constant level VR. While if the base station is OFF, the detection output is lower than the constant level. The detection outputs allow the mobile radio unit B to determine the transmission state of the base station.

Assuming that the control section 109 of the mobile radio unit B controls the amplification coefficient of the automatic gain control amplifier 102 based on the detection output of the RSSI 105, the mobile radio unit B operates the automatic gain control amplifier 102 by setting the amplification coefficient to relatively a large constant value NA if the timing of receiving message is not addressed to the subject mobile radio unit and the base station is not OFF as FIG. 2(d) shows. While if the timing of receiving message is addressed to the subject mobile radio unit and/or the base station is OFF, the control section 109 sets the amplification coefficient to "0" so as to keep the amplification value of the automatic gain control amplifier constant.

When the base station is OFF, since operation of the automatic gain control amplifier 102 is not required, the amplification coefficient is set to "0". However the amplification coefficient is set to relatively a large constant value NA until the subject mobile radio unit starts receiving. Accordingly when the subject mobile radio unit starts receiving, the automatic gain control amplifier is operated with relatively a large amplification coefficient, allowing to cope with signal level fluctuation resulted from inputting the received signal. As a result, the mobile radio unit is enabled to receive the signal at an approximate level.

After the mobile radio unit starts receiving, the amplification coefficient is set to "0". The mobile radio unit continues reception with the fixed amplification coefficient which has been set at the beginning of reception, resulting in preventing the amplification degree from being widely ranged and the level of the received signal from being fluctuated. This results in preventing reception errors accompanied with fluctuation of the received signal level.

The mobile radio unit is so constructed to increase the amplification coefficient to relatively a large value at a timing of communication not addressed to the subject mobile radio unit and to decrease the amplification coefficient to a small value at a timing of communication addressed to the subject mobile radio unit. This allows the mobile radio unit to receive in an appropriate condition with the aid of sufficient follow-up ability to the fluctuation of the received signal, as well as preventing reception errors due to widely ranged fluctuation of the amplification degree.

The mobile radio unit can be so constructed to operate the automatic gain control function only in a predetermined time interval just before the reception timing of the subject mobile radio unit starts.

For example, the mobile radio unit B keeps the automatic gain control amplification degree constant by setting the amplification coefficient to "0" when output of the RSSI is lower than a predetermined level. Even if the output of the RSSI is higher than the predetermined level and the amplification coefficient is set to "0" to start automatic gain control when the subjected mobile radio unit is not in communication timing and in the predetermined time interval just before the communication timing of the subjected mobile radio unit.

In case of FIG. 2(e), automatic gain control operations are conducted by setting the amplification coefficient to "NA" only for a predetermined time interval just before the communication timing of the mobile radio unit B, that is, the time necessary to receive the synchronous signal and the data of the mobile radio unit A. Then, the amplification degree of the automatic gain control is kept constant by setting the amplification coefficient "0" at the communication timing of the mobile radio unit B.

These operations are controlled by the built-in counter included in the control section 109. For example, the mobile radio unit B can recognize the next communication timing of the subjected mobile radio unit after synchronization has been established. So, it sets a predetermined time interval in which counting operations are conducted a little shorter time interval than the time interval between a communication timing and next communication timing of the subjected mobile radio unit. And counting operations are started at the communication timing of the subjected mobile radio unit B and the amplification coefficient is set to "0" in a predetermined time from the time. After a predetermined time has elapsed and counting operations have been completed, the amplification coefficient becomes a constant value NA. This value is kept until the time just before the communication timing of the subjected mobile radio unit.

Such operations serve to reduce the operation time when the amplification coefficient varies as well as reducing power consumption accompanied with the operation.

Figure 3:
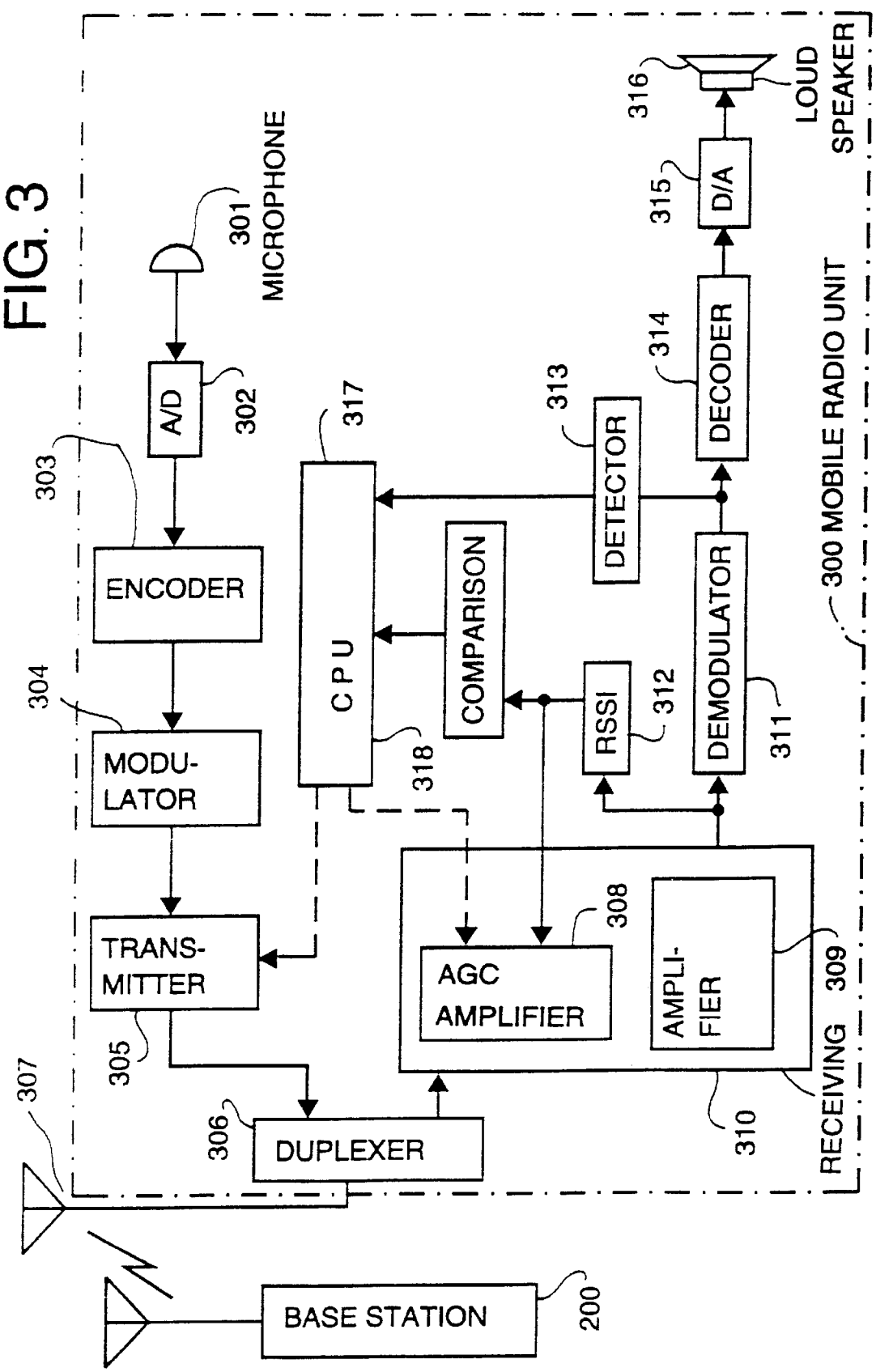
FIG. 3 is a block diagram of a second embodiment of the present invention.

FIG. 3 is a block diagram of another embodiment of the present invention applied to a mobile radio unit such as a portable phone. Referring to FIG. 3, a solid line designates a signal line and a dashed line designates a control line.

A mobile radio unit 300 converts a voice signal input from a microphone 301 into an electric signal. The electric signal is converted into a digital signal through an A/D converter 302 and then encoded through an encoder section 303. The signal is further modulated through a modulator 304 and transmitted from a transmission section 305 through a duplexer 306 for transmission and reception commonly used with the antenna 307.

The antenna 307 receives electric waves output from a base station 200 and input to a receiving section 310 through the duplexer 306. In the receiving section 310, the signal is amplified through the automatic gain control amplification section 308 and further subjected to other amplifier 309, for example, super heterodyne, to output a signal. It is, then demodualted through a demodulator 311. The demodulated data is decoded through a decoding section 314 and converted into an analogue voice signal through a D/A converter 315, thus outputting voices from a speaker 316.

The output signal from the receiving section 310 is also input to an RSSI 312 where received signal strength is detected. The output from the RSSI 312 is input to the automatic gain control amplification section 308 for executing automatic gain control function. The output of the RSSI 312 is compared with a constant value VR through a comparator 318. The resultant signal is input to a CPU 317.

The demodulated signal from the demodulator section 311 is input to a detection section 313 where synchronization is detected. The synchronization detection result is input to the CPU 317 together with the data received by the subject mobile radio unit which has been demodulated. The CPU 317 determines the reception state of the subject mobile radio unit based on the synchronization detection result, the data received by the subject mobile radio unit and/or the output of the RSSI 312. If it is determined that the timing of communication is addressed to the subject mobile radio unit or the base station is OFF determined by the output of the RSSI 312 which is smaller than VR, the amplification coefficient of the automatic gain control amplification section 308 is set to a small value NB (="0") which has been predetermined.

If it is determined that the base station is ON determined by the output of the RSSI 312 which is larger than the VR and the timing of communication is not addressed to the subject mobile radio unit, the amplification coefficient of the automatic gain control amplifier section 308 is set to the predetermined value NA. The value NA is set to be greater than the value NB. Those values of NA and NB have been already stored in a built-in memory of, for example, the CPU 317.

Figure 4:
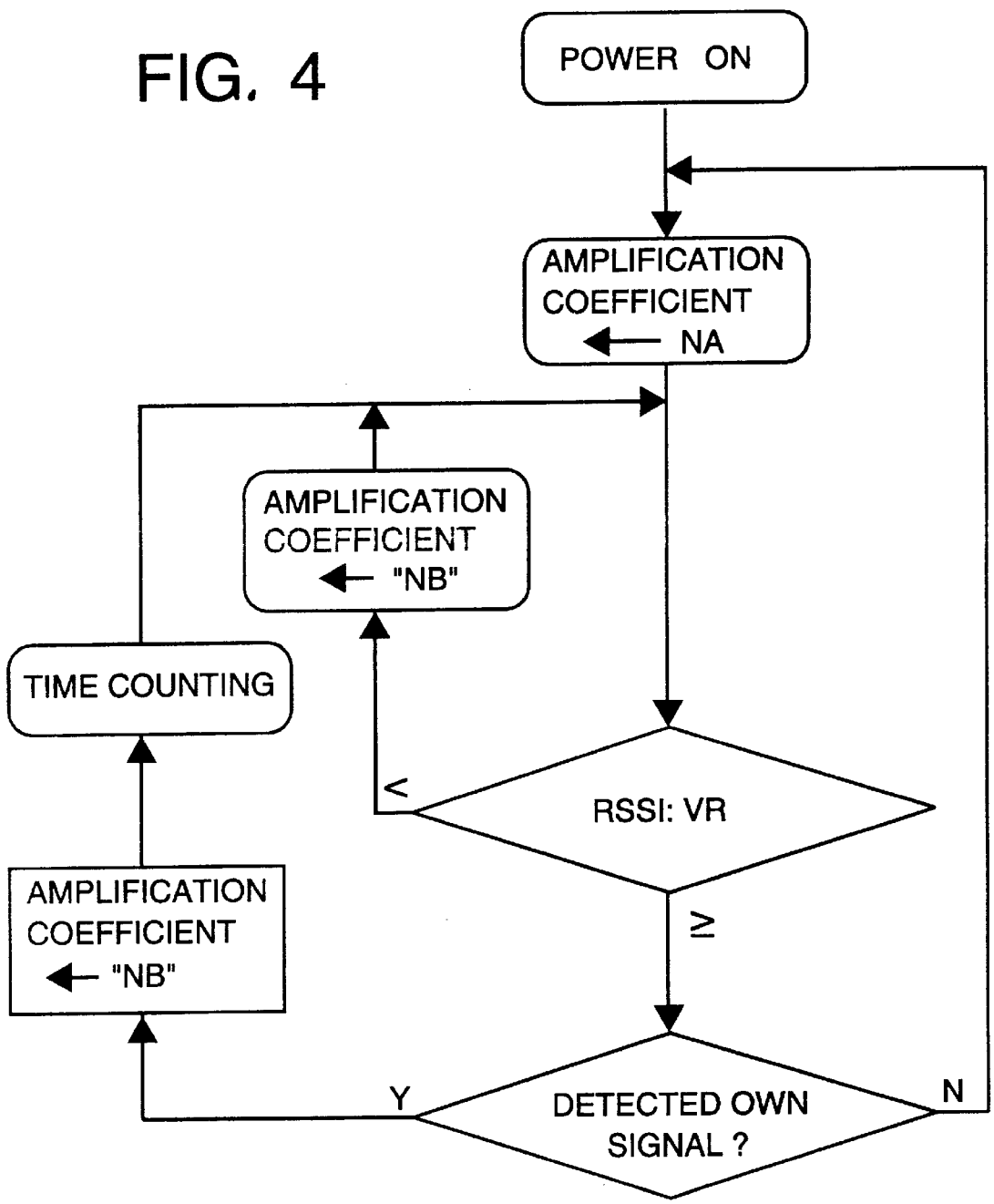
FIG. 4 is a flow chart showing an operation of the second embodiment.

FIG. 4 is a flow chart showing the operation of the mobile radio unit of FIG. 3. After turning the power ON, the CPU 317 sets the amplification coefficient of the automatic gain control amplification section 308 to the value NA. If the output of the RSSI 312 is larger than the predetermined value VR determined by detecting the received signal strength and the timing of communication is not addressed to the subject mobile radio unit, the amplification coefficient is kept to be NA.

While if the output of the RSSI 312 is smaller than the predetermined value VR, the CPU 317 sets the amplification coefficient of the automatic gain control amplification section 308 to the value NB (="0"). The amplification value of the automatic gain control amplification section 308 is kept unchanged. If the output of the RSSI 312 is larger than the predetermined value VR and the timing of communication is addressed to the subject mobile radio unit, the amplification coefficient is set to "0" and the amplification value of the automatic gain control amplification section 308 is kept unchanged. Then the CPU 317 drives its built-in timer to execute time count for a given time interval. The time count is continued just before the communication timing addressed to the next mobile radio unit starts.

After reaching synchronization, the subject mobile radio unit recognizes the next communication timing addressed thereto. The time count period can be shorter than the time length from one communication timing to the next. If the output of the RSSI 312 becomes larger than the value VR just before the next communication timing starts, the automatic gain control amplification section 308 starts its operation.

In this embodiment, the amplification coefficient is set to relatively a large value NA just before the subject mobile radio unit starts receiving in the same timing manner as shown in FIGS. 1 and 2. After the reception starts, the amplification coefficient is fixed to "0", so as to set the reception level appropriately as quick as possible. This feature allows to avoid change of the reception level resulted from a large degree of amplification fluctuation, thus eliminating reception errors.

Figure 5:
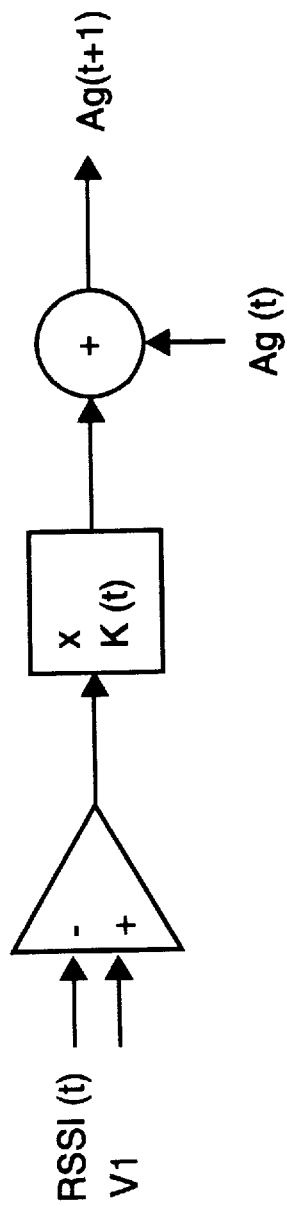
FIG. 5 is a graphical representation showing a relation between an amplification coefficient and an amplification degree.

FIG. 5 shows one example of a relationship between the amplification coefficient and amplification degree of the automatic gain control amplification section 308. More specifically this shows the relationship between the amplification coefficient (k(t) in FIG. 5) and amplification values (Ag(t), Ag(t+1) in FIG. 5). The output value of the RSSI 312 at time t is referred to as RSSI(t) and the amplification coefficient is referred to as k(t). The relationship between the amplification value Ag(t+1) of the automatic gain control amplification section 308 at the time t+1 and the amplification value Ag(t) of the automatic gain control amplification section 308 at the time t is expressed by the following equation.

$$Ag(t+1)=Ag(t)-k(t)\times[RSSI(t)-V1]$$

where V1 denotes an ideal value of the RSSI.

If the amplification coefficient k(t) is large, the RSSI(t) rapidly approaches the ideal value V1. While if the amplification coefficient k(t) is small, the RSSI(t) slowly approaches the ideal value V1. If k(t)="0", the amplification value of the automatic gain control amplifier is kept constant. The value k(t) is either NA or NB (NA>NB).

In each embodiment, the small value of the amplification coefficient is set to "0". However it can be set to any value close to "0". If the amplification coefficient is set to a large value, it can be set to the maximum one.

What is claimed is:

1. A mobile radio unit for receiving a time division multiplexed transmission signal, comprising:

detection means for detecting a signal strength of a received signal;

automatic gain control amplification means for automatically gain controlling an amplification degree of said received signal in response to an amplification coefficient controlled by a control signal and in response to a detection result of said detection means, wherein said amplification coefficient is variable with respect to said received signal strength; and control means for outputting the control signal to set:
   said amplification coefficient to a predetermined value when a transmission station does not transmit a signal or when a timing interval of said received signal is addressed to said mobile radio unit, and
   said amplification coefficient to a value larger than said predetermined value when said transmission station transmits said signal and said timing interval of said received signal is not addressed to said mobile radio unit.

2. The mobile radio unit of claim 1, wherein said control means comprises means for detecting said timing interval addressed to said mobile radio unit.

3. The mobile radio unit of claim 1, wherein said predetermined value is 0.

4. A mobile radio unit for receiving a time division multiplexed transmission signal, comprising:

detection means for detecting a signal strength of a received signal;

automatic gain control amplification means for automatically gain controlling an amplification degree of said received signal in response to an amplification coefficient controlled by a control signal and in response to a detection result of said detection means, wherein said amplification coefficient is variable with respect to said received signal strength; and control means for outputting the control signal to set:
   said amplification coefficient to a predetermined value when a transmission station does not transmit a signal or when a timing interval of said received signal is a predetermined time interval starting just before and including a timing interval addressed to said mobile radio unit, and
   said amplification coefficient to a value larger than said predetermined value when said transmission station transmits said signal and said timing interval is other than said predetermined time interval.

5. The mobile radio unit of claim 4, wherein said control means comprises means for detecting own communication timing.

6. The mobile radio unit of claim 4, wherein said predetermined value is 0.

7. The mobile radio unit of claim 4, wherein said predetermined time interval occurs after reception of a synchronous signal.

8. A method of automatic gain control for a mobile radio unit, comprising the steps of:

detecting a signal strength RSSI(t) of a received signal at time t;

determining whether a transmission station transmits a signal in response to a detected signal strength RSSI(t);

setting an amplification coefficient k(t) to a predetermined value when said transmission station does not transmit a signal or when a timing interval of said received signal is addressed to said mobile radio unit;

setting said amplification coefficient k(t) to a value other than said predetermined value when said transmission station transmits a signal and said timing interval is not addressed to said mobile radio unit;

amplifying said received signal in response to an amplification value shown by the following equation, $Ag(t+1)=Ag(t)-k(t)\times(RSSI(t)-V1)$, where $Ag(t+1)$ expresses an amplification value at time $t+1$, $Ag(t)$ is an amplification value at time t and V1 is an ideal value of said signal strength.

9. The method of automatic gain control for a mobile radio unit of claim 8, wherein said predetermined value is 0.

10. A method of automatic gain control for a mobile radio unit, comprising steps of:

detecting a signal strength RSSI (t) of a received signal at time t;

determining whether a transmission station transmits a signal in response to a detected signal strength RSSI(t);

setting an amplification coefficient k(t) to a predetermined value when said transmission station does not transmit a signal or when a timing interval of said received signal is a predetermined time interval starting just before and including a timing interval addressed to said mobile radio unit;

setting said amplification coefficient k(t) to a value other than said predetermined value when said transmission station transmits a signal and said timing interval is other than said predetermined time interval; and amplifying said received signal in response to an amplification value shown by the following equation, $Ag(t+1)=Ag(t)-k(t)\times(RSSI(t)-V1)$, where $Ag(t+1)$ expresses an amplification value at time $t+1$, $Ag(t)$ is an amplification value at time t and V1 is an ideal value of said signal strength.

11. The method of automatic gain control for a mobile radio unit of claim 10, wherein aid predetermined time interval occurs after reception of a synchronous signal.

* * * * *